United States Patent
Ito et al.

(10) Patent No.: US 9,621,116 B2
(45) Date of Patent: Apr. 11, 2017

(54) ACTIVE LOAD CIRCUIT AND SEMICONDUCTOR INTEGRATED CIRCUIT

(71) Applicant: KABUSHIKI KAISHA TOSHIBA, Minato-ku, Tokyo (JP)

(72) Inventors: Rui Ito, Chigasaki Kanagawa (JP); Naohiro Matsui, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/844,188

(22) Filed: Sep. 3, 2015

(65) Prior Publication Data
US 2016/0268977 A1    Sep. 15, 2016

(30) Foreign Application Priority Data
Mar. 9, 2015 (JP) ................. 2015-046339

(51) Int. Cl.
*H03F 3/45* (2006.01)
*H03F 1/42* (2006.01)

(52) U.S. Cl.
CPC ............ *H03F 1/42* (2013.01); *H03F 3/4521* (2013.01); *H03F 3/45183* (2013.01); *H03F 3/45659* (2013.01); *H03F 2203/45008* (2013.01); *H03F 2203/45112* (2013.01); *H03F 2203/45116* (2013.01); *H03F 2203/45418* (2013.01); *H03F 2203/45424* (2013.01)

(58) Field of Classification Search
CPC .............. H03F 1/42; H03F 1/486; H03F 3/45
USPC ........................................ 330/292, 253, 257
See application file for complete search history.

(56) References Cited

U.S. PATENT DOCUMENTS

| | | | |
|---|---|---|---|
| 7,633,344 B2 | 12/2009 | Yamaguchi | |
| 2003/0102908 A1* | 6/2003 | Ausserlechner | H03F 1/086 330/9 |

(Continued)

FOREIGN PATENT DOCUMENTS

| | | |
|---|---|---|
| JP | 2007311448 A | 11/2007 |
| JP | 2009111933 A | 5/2009 |
| WO | 2005062150 A1 | 7/2005 |

OTHER PUBLICATIONS

T. Voo, et al., "High-speed current mirror resistive compensation technique", Electronics Letters, Feb. 16, 1995, vol. 31, No. 4, pp. 248-250.

(Continued)

*Primary Examiner* — Steven J Mottola
(74) *Attorney, Agent, or Firm* — Holtz, Holtz & Volek PC

(57) ABSTRACT

According to one embodiment, there is provided an active load circuit including a first transistor, a second transistor, a first resistor, a second resistor, a third transistor, a fourth transistor, a fifth transistor, a sixth transistor, a seventh transistor, an eighth transistor, and a line. The third transistor is placed between the first transistor and the first reference node. The fourth transistor is placed between the second transistor and the first reference node. The seventh transistor is placed between the fifth transistor and the first reference node. The eighth transistor is placed between the sixth transistor and the first reference node. A line connecting a fifth node between the fifth transistor and the seventh transistor and a sixth node between the sixth transistor and the eighth transistor.

20 Claims, 9 Drawing Sheets

(56) References Cited

U.S. PATENT DOCUMENTS

2006/0125563 A1* 6/2006 Elder .................. H03F 1/30
  330/253
2007/0164809 A1 7/2007 Fukuda et al.

OTHER PUBLICATIONS

ThartFaj Voo, et al., "A Novel High Speed Current Mirror Compensation Technique and Application", Circuits and Systems, 1995, ISCAS 1995, pp. 2108-2111.

* cited by examiner

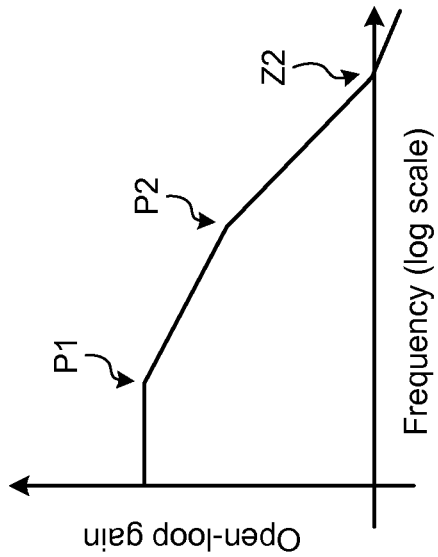
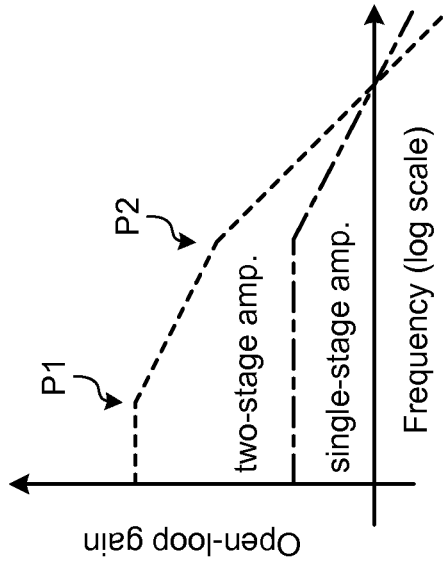
FIG.5A
FIG.5B

ACTIVE LOAD CIRCUIT AND SEMICONDUCTOR INTEGRATED CIRCUIT

CROSS-REFERENCE TO RELATED APPLICATIONS

This application is based upon and claims the benefit of priority from Japanese Patent Application No. 2015-046339, filed on Mar. 9, 2015; the entire contents of which are incorporated herein by reference.

FIELD

Embodiments described herein relate generally to an active load circuit and a semiconductor integrated circuit.

BACKGROUND

In amplifiers, a differential signal received at an input stage is amplified by an active load circuit and outputted as a differential signal. In this case, if a current mirror circuit is used in the active load circuit, parasitic capacitances of transistors are connected to the mirror source and the mirror destination respectively, so that the frequency band of the amplifier is likely to become narrower. Thus, it is desired to make the active load circuit broader in frequency band.

BRIEF DESCRIPTION OF THE DRAWINGS

FIGS. 5A and 5B are graphs showing the operation of the semiconductor integrated circuit according to the second embodiment;

DETAILED DESCRIPTION

In general, according to one embodiment, there is provided an active load circuit including a first transistor, a second transistor, a first resistor, a second resistor, a third transistor, a fourth transistor, a fifth transistor, a sixth transistor, a seventh transistor, an eighth transistor, and a line. The first transistor is placed between a first node and a first reference node. The second transistor is placed between a second node and the first reference node. One end of the first resistor is connected to gate of the first transistor and the other end of the first resistor is connected to the first node. One end of the second resistor is connected to gate of the second transistor and the other end of the second resistor is connected to the second node. The third transistor is placed between the first transistor and the first reference node. The fourth transistor is placed between the second transistor and the first reference node. The fifth transistor, together with the second transistor, formes a current mirror circuit and is placed between a third node and the first reference node. The sixth transistor, together with the first transistor, formes a current mirror circuit and is placed between a fourth node and the first reference node. The seventh transistor is placed between the fifth transistor and the first reference node. The eighth transistor is placed between the sixth transistor and the first reference node. a line connecting a fifth node between the fifth transistor and the seventh transistor and a sixth node between the sixth transistor and the eighth transistor.

Exemplary embodiments of an active load circuit will be explained below in detail with reference to the accompanying drawings. The present invention is not limited to the following embodiments.

(First Embodiment)

Figure 1:
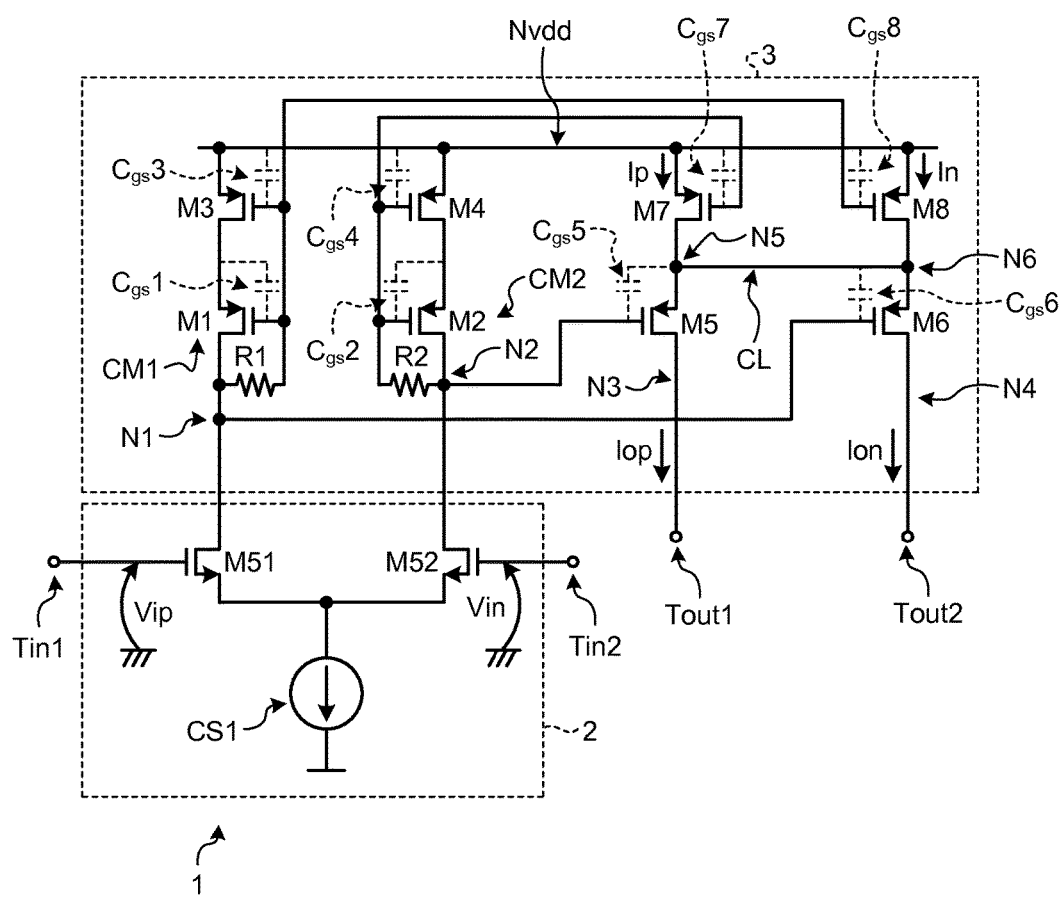
FIG. 1 is a circuit diagram showing the configuration of an active load circuit according to a first embodiment.

An active load circuit 3 according to the first embodiment will be described using FIG. 1. FIG. 1 is a circuit diagram showing the configuration of the active load circuit 3.

The active load circuit 3 is included in an amplifier 1. The amplifier 1 includes an input stage 2 and the active load circuit 3. In the amplifier 1, a differential signal (differential voltages Vip, Vin) received by the input stage 2 via a differential input pair (a pair of input terminals Tin1, Tin2) is amplified by the active load circuit 3 to output as a differential signal (differential currents Iop, Ion) through a differential output pair (a pair of output terminals Tout1, Tout2). The input stage 2 has transistors M51, M52 and a current source CS1. The transistors M51, M52 are, for example, NMOS transistors. The gates of the transistors M51, M52 are connected to the differential input pair Tin1, Tin2. The differential output pair Tout1, Tout2 are connected to nodes N3, N4 in the active load circuit 3.

For example, in designing the amplifier 1, current mirror circuits are used in the active load circuit 3. The active load circuit 3 has transistors M1, M2, M5, and M6. The transistors M1 and M6 form a current mirror circuit CM1. The transistors M2 and M5 form a current mirror circuit CM2.

The transistor M1 is placed between a node N1 and a power supply node (first reference node) Nvdd. The power supply node Nvdd indicates any position on the power supply line and has power supply potential. The transistor M1 is, for example, a PMOS transistor. The drain and gate of the transistor M1 are electrically connected to the node N1. The node N1 is connected to the drain of the transistor M51. The transistor M6 is placed between a node N4 and the power supply node Nvdd. The transistor M6 is, for example, a PMOS transistor. As to the transistor M6, the drain is electrically connected to the node N4, and the gate is electrically connected to the node N1. Thus, the transistors M1 and M6 form the current mirror circuit CM1.

The transistor M2 is placed between a node N2 and the power supply node Nvdd. The transistor M2 is, for example, a PMOS transistor. The drain and gate of the transistor M2 are electrically connected to the node N2. The node N2 is connected to the drain of the transistor M52. The transistor M5 is placed between the node N3 and the power supply node Nvdd. The transistor M5 is, for example, a PMOS transistor. As to the transistor M5, the drain is electrically connected to the node N3, and the gate is electrically connected to the node N2. Thus, the transistors M2 and M5 form the current mirror circuit CM2.

In the current mirror circuit, parasitic capacitances (gate-to-source parasitic capacitances) of transistors are connected to the mirror source and the mirror destination respectively. For example, in the current mirror circuit CM1, parasitic capacitances Cgs1 and Cgs6 are connected to the transistors M1 and M6 respectively. In the current mirror circuit CM2, parasitic capacitances Cgs2 and Cgs5 are connected to the transistors M2 and M5 respectively. If parasitic capacitances of transistors are connected to the mirror source and the mirror destination respectively, then the amount of current to flow needs to be increased in order to speed up, so that the consumption current is likely to increase. Further, in the current mirrors that are an active load, the parasitic capacitances (Cgs1, Cgs2) of transistors, the mirror source, and the parasitic capacitances (Cgs5, Cgs6) of transistors, the mirror destination, affect the frequency band of the amplifier 1, so that the band of the amplifier 1 is likely to become narrower.

Accordingly, in the active load circuit 3, a resistor R1 is inserted between the gate of the transistor M1 and the node N1, and a resistor R2 is inserted between the gate of the transistor M2 and the node N2. One end of the resistor R1 is electrically connected to the gate of the transistor M1, and the other end is electrically connected to the node N1. One end of the resistor R2 is electrically connected to the gate of the transistor M2, and the other end is electrically connected to the node N2. The active load including the resistors R1 and R2 can reduce the influence of the parasitic capacitances Cgs1, Cgs2 of the transistors M1, M2 on the band of the amplifier 1. Thus, it seems possible to broaden the band of (speed up) the amplifier 1 as compared with the case where the resistors R1 and R2 do not exist.

However, in the current mirror circuits CM1, CM2, for example, where the ratio of a dimension (=W/L, W: Gate width, L: Gate length) of the mirror source to the dimension of the mirror destination is at about 1:1, the gain is about 0 dB. In order to raise the gain, the dimension ratio of the mirror destination to the mirror source needs to be increased to 1:2 or so on. If the dimension ratio of the mirror destination to the mirror source is increased, the band of the amplifier 1 is likely to become narrow because the parasitic capacitances of the transistors increase as the dimensions of the transistors increase.

If the dimensions of the transistors are reduced to decrease the parasitic capacitances of the transistors in order to broaden the band of the amplifier 1, the matching between the mirror source and the mirror destination is likely to degrade. That is, the dimension ratio of the mirror destination to the mirror source is likely to deviate from a target value, so that the mismatching (DC offset) of the common mode output voltages of the amplifier 1 is likely to increase.

Accordingly, in the present embodiment, transistors M3, M4, M7, M8 that operate as degeneration resistors are added to the active load circuit 3, and in addition the drains of the transistors M7, M8 are connected by a line CL, thereby achieving both suppression of the DC offset and broadening the band (speeding up) of the amplifier 1.

Specifically, the active load circuit 3 has the transistors M3, M4, M7, M8 and the line CL.

The transistor M3 is placed between the transistor M1 and the power supply node Nvdd. The transistor M3 is, for example, a PMOS transistor. As to the transistor M3, the source is electrically connected to the power supply node Nvdd, and the drain is electrically connected to the source of the transistor M1.

The transistor M4 is placed between the transistor M2 and the power supply node Nvdd. The transistor M4 is, for example, a PMOS transistor. As to the transistor M4, the source is electrically connected to the power supply node Nvdd, and the drain is electrically connected to the source of the transistor M2.

The transistor M7 is placed between the transistor M5 and the power supply node Nvdd. The transistor M7 is, for example, a PMOS transistor. As to the transistor M7, the source is electrically connected to the power supply node Nvdd, and the drain is electrically connected to the source of the transistor M5 via a node N5.

The transistor M8 is placed between the transistor M6 and the power supply node Nvdd. The transistor M8 is, for example, a PMOS transistor. As to the transistor M8, the source is electrically connected to the power supply node Nvdd, and the drain is electrically connected to the source of the transistor M6 via a node N6.

The transistors M3, M4, M7, M8 are configured to operate in a linear region. For example, the transistors M3, M7 can operate as degeneration resistors to decrease the common-mode transconductance gm for the current mirror circuit CM1. The transistors M4, M8 can operate as degeneration resistors to decrease the common-mode transconductance gm for the current mirror circuit CM2. Thus, the transistors M3, M4, M7, M8 can improve the matching in common mode between the mirror source and the mirror destination in the current mirror circuits CM1, CM2. In this case, the dimensions of the transistors M1, M2, M5, M6 may be even.

The gates of the transistor M1, of the transistor M3, and of the transistor M8 are electrically connected to each other and electrically connected to the node N1 via the resistor R1. Thus, a bias voltage to make them operate in the linear region can be supplied to the gates of the transistors M3 and M8.

The gates of the transistor M2, of the transistor M4, and of the transistor M7 are electrically connected to each other and electrically connected to the node N2 via the resistor R2. Thus, a bias voltage to make them operate in the linear region can be supplied to the gates of the transistors M4 and M7.

In the active load circuit 3, the parasitic capacitances Cgs1, Cgs3, Cgs8 of the transistors M1, M3, M8 are made by the resistor R1 to be difficult to see from the node N4 on the output terminal Tout2 side. The parasitic capacitances Cgs2, Cgs4, Cgs7 of the transistors M2, M4, M7 are made by the resistor R2 to be difficult to see from the node N3 on the output terminal Tout1 side. Thus, the influence of the parasitic capacitances Cgs1, Cgs2, Cgs3, Cgs4, Cgs7, Cgs8 on the band of the amplifier 1 can be reduced.

Further, the nodes N5, N6 are electrically connected by the line CL. The node N5 is connected to the drain of the transistor M7 and the source of the transistor M5. The node N6 is connected to the drain of the transistor M8 and the source of the transistor M6. A P-side current Ip flowing through the transistor M7 and an N-side current In flowing through the transistor M8 can flow into the line CL to cancel each other out. For example, the P-side current Ip and the N-side current In are substantially equal in the absolute value of the amplitude and opposite in phase. Letting a P-side voltage Vp be the voltage on the node N5 corresponding to the P-side current Ip and an N-side voltage Vn be the voltage on the node N6 corresponding to the N-side current In, the P-side voltage Vp and the N-side voltage Vn are substantially equal in the absolute value of the amplitude and opposite in phase. If Vp>0>Vn, the P-side current Ip flows via the node N5 to the line CL to the node N6, and the P-side current Ip and the N-side current In can merge at the node N6 to cancel each other out. If Vp<0<Vn, the N-side current In flows via the node N6 to the line CL to the node N5, and the P-side current Ip and the N-side current In can merge at the node N5 to cancel each other out. Thus, the influence of the degeneration resistors (transistors M7, M8) on the differential component between the transistors M5, M6, the mirror destinations, in the current mirror circuits CM1, CM2 can be suppressed substantially. Therefore, the differential transconductance gm for the current mirror circuits CM1, CM2 can be raised by the line CL. That is, when differential operation is considered, the differential transconductance gm is different between the mirror source and the mirror destination in the current mirror circuits CM1, CM2, and the differential transconductance gm of the mirror destination can be made higher than the differential transconductance gm of the mirror source, so that, e.g., the gain in the low frequency region can be increased.

As described above, in the first embodiment, because the transistors M3, M4, M7, M8 operate as degeneration resistors in the active load circuit 3, the common-mode transconductance gm for the current mirror circuits CM, CM2 can be decreased. Thus, the transistors M3, M4, M7, M8 can improve the matching in common mode between the mirror source and the mirror destination in the current mirror circuits CM1, CM2, so that the mismatching (DC offset) of the common mode output voltages can be suppressed. Further, because the drains of the transistors M7, M8 are connected by the line CL, the differential transconductance gm for the current mirror circuits CM1, CM2 can be raised. Therefore, the gain of the amplifier 1 can be increased, and the amplifier 1 can be broadened in band (speeded up). Thus, both suppression of the DC offset and broadening the band (speeding up) of the amplifier 1 can be achieved.

Note that, in the active load circuit 3 shown in FIG. 1, by changing the power supply node Nvdd to a ground node (first reference node) and replacing the transistors M1 to M8 with transistors opposite in conductivity type, an active load circuit having the same function may be configured. The ground node indicates any position on the ground line and has power supply potential and has ground potential.

Figure 2:
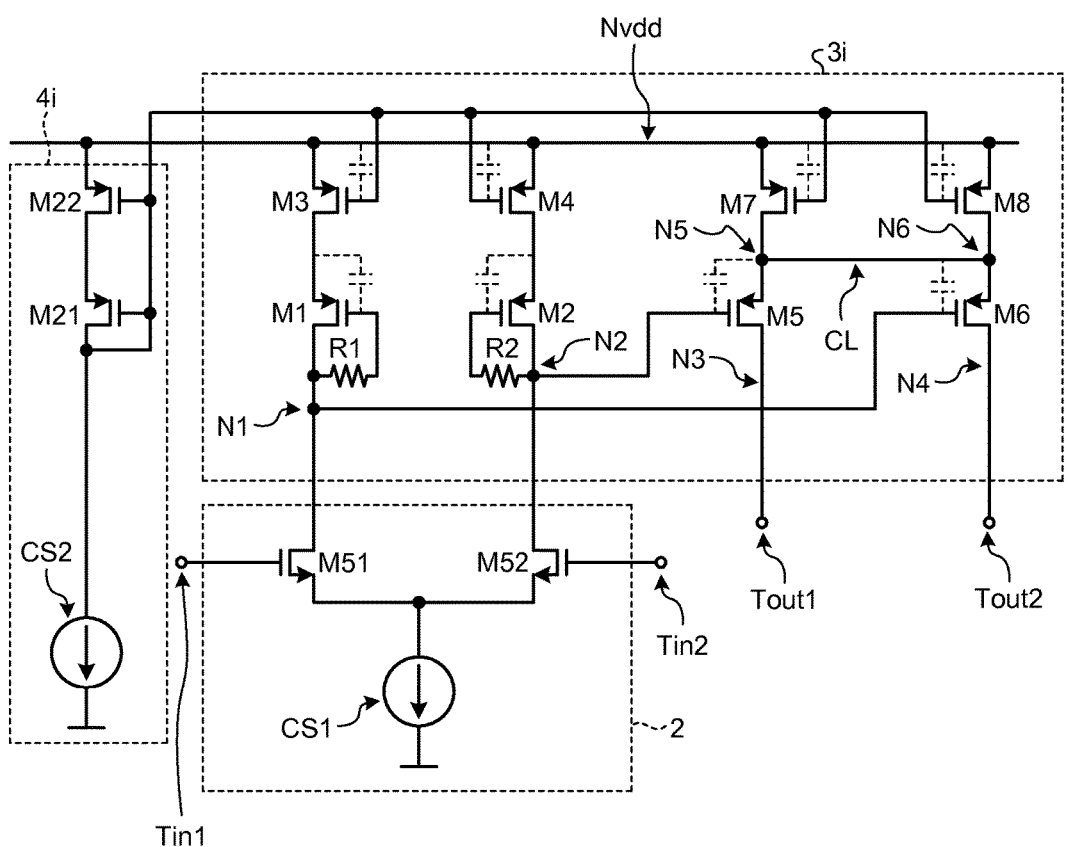
FIG. 2 is a circuit diagram showing the configuration of an active load circuit according to a modified example of the first embodiment.

Alternatively, as shown in FIG. 2, in an active load circuit 3i, the transistors M3, M4, M7, M8 may be configured to operate in the linear region with a bias being supplied from a bias circuit 4i to their gates. That is, the bias circuit 4i is electrically connected to the gates of the transistor M3, of the transistor M4, of the transistor M7, and of the transistor M8. The bias circuit 4i has replica transistors M21, M22 and a current source CS2. The replica transistor M21 is formed to have characteristics equivalent to those of the transistor M1 and, for example, has dimensions equivalent to those of the transistor M1. The replica transistor M22 is formed to have characteristics equivalent to those of the transistor M3 and, for example, has dimensions equivalent to those of the transistor M3. Thus, a replica bias equivalent to the bias supplied to the gates of the transistors M3, M4, M7, M8 in the configuration shown in FIG. 1 can be supplied to the gates of the transistors M3, M4, M7, M8, so that the transistors M3, M4, M7, M8 can be made to operate in the linear region.

Figure 3:
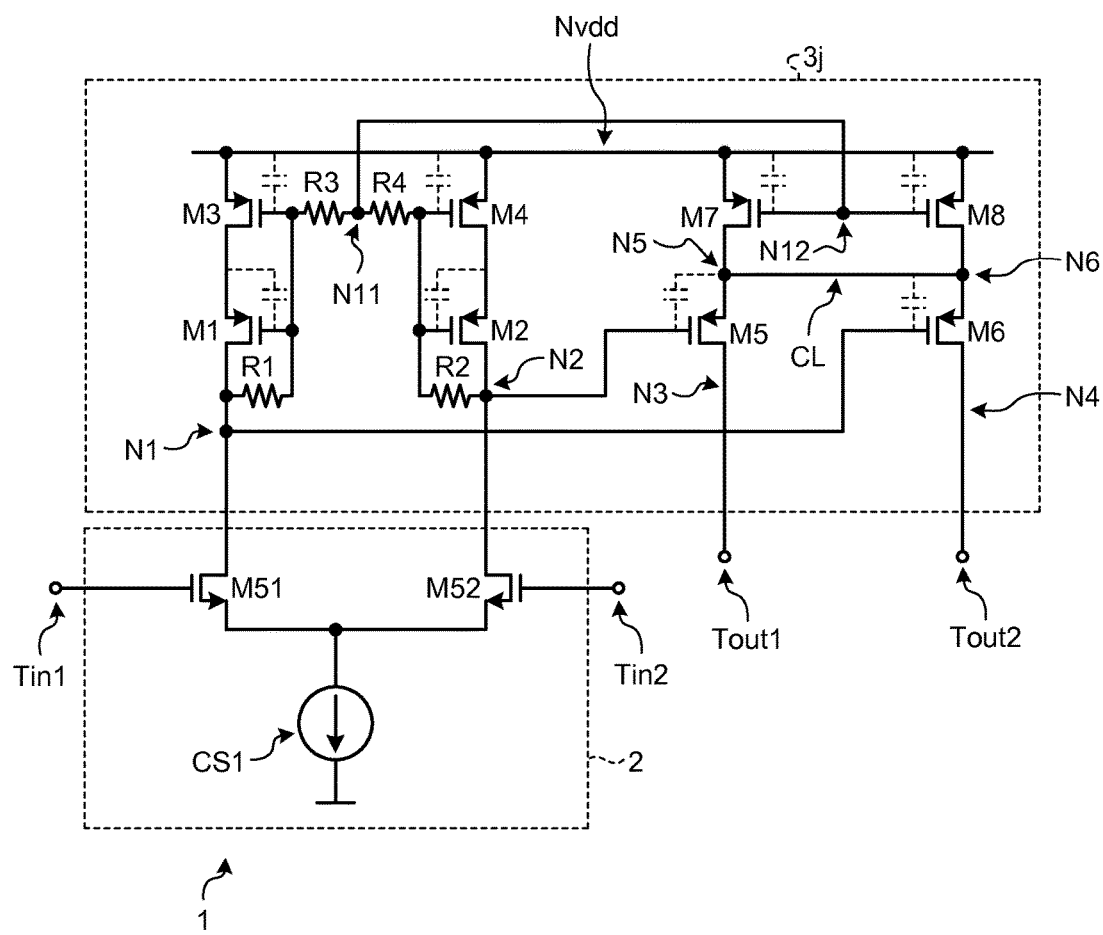
FIG. 3 is a circuit diagram showing the configuration of an active load circuit according to another modified example of the first embodiment.

Alternatively, as shown in FIG. 3, an active load circuit 3j may be configured such that the common mode voltage of the transistors M3, M4 is extracted and applied to the gates of the transistors M7, M8. That is, the active load circuit 3j further has resistors R3, R4. One end of the resistor R3 is electrically connected to the gate of the transistor M3, and the other end is electrically connected to an intermediate node N11. One end of the resistor R4 is electrically connected to the gate of the transistor M4, and the other end is electrically connected to the intermediate node N11. The intermediate node N11 is electrically connected to the gates of the transistors M7 and M8 via a node N12.

In this configuration, the transistor M3 is connected at the gate to the gate of the transistor M1 and can operate in the linear region as in the configuration of FIG. 1. The transistor M4 is connected at the gate to the gate of the transistor M2 and can operate in the linear region as in the configuration of FIG. 1. By making the resistance of the resistor R3 and the resistance of the resistor R4 even, the common mode voltage of the transistors M3, M4 can be extracted to be a voltage on the intermediate node N11, and the common mode voltage extracted can be transmitted from the intermediate node N11 to the node N12 to the gates of the transistors M7, M8. Thus, the transistors M7, M8 can be made to operate in the linear region. Further, because accuracy in having the P-side current Ip of the transistor M7 and the N-side current In of the transistor M8 cancel out by the line CL can be improved, the differential transconductance gm for the current mirror circuits CM1, CM2 can be further raised.

(Second Embodiment)

Figure 4:
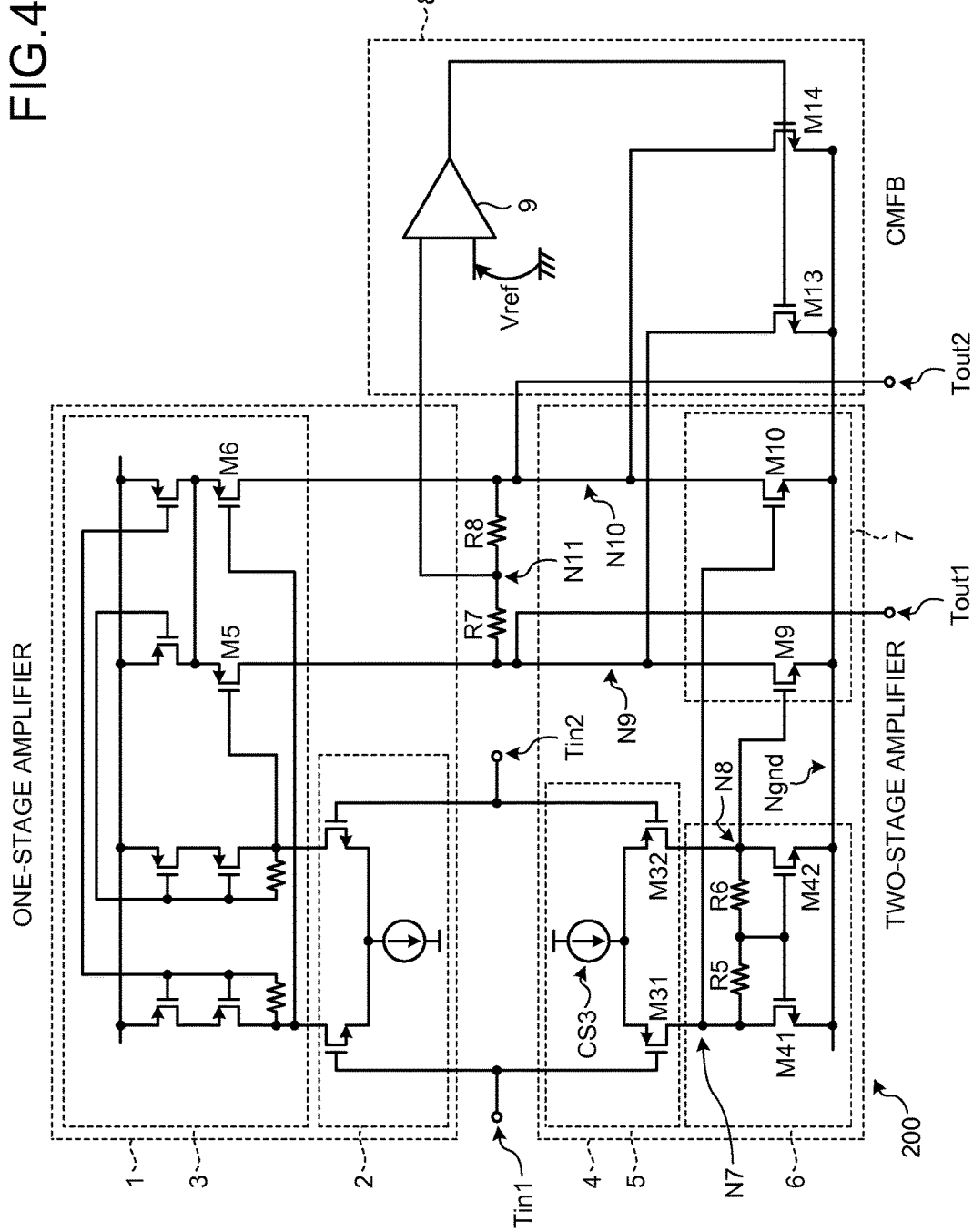
FIG. 4 is a circuit diagram showing the configuration of a semiconductor integrated circuit according to a second embodiment.
Figure 6:
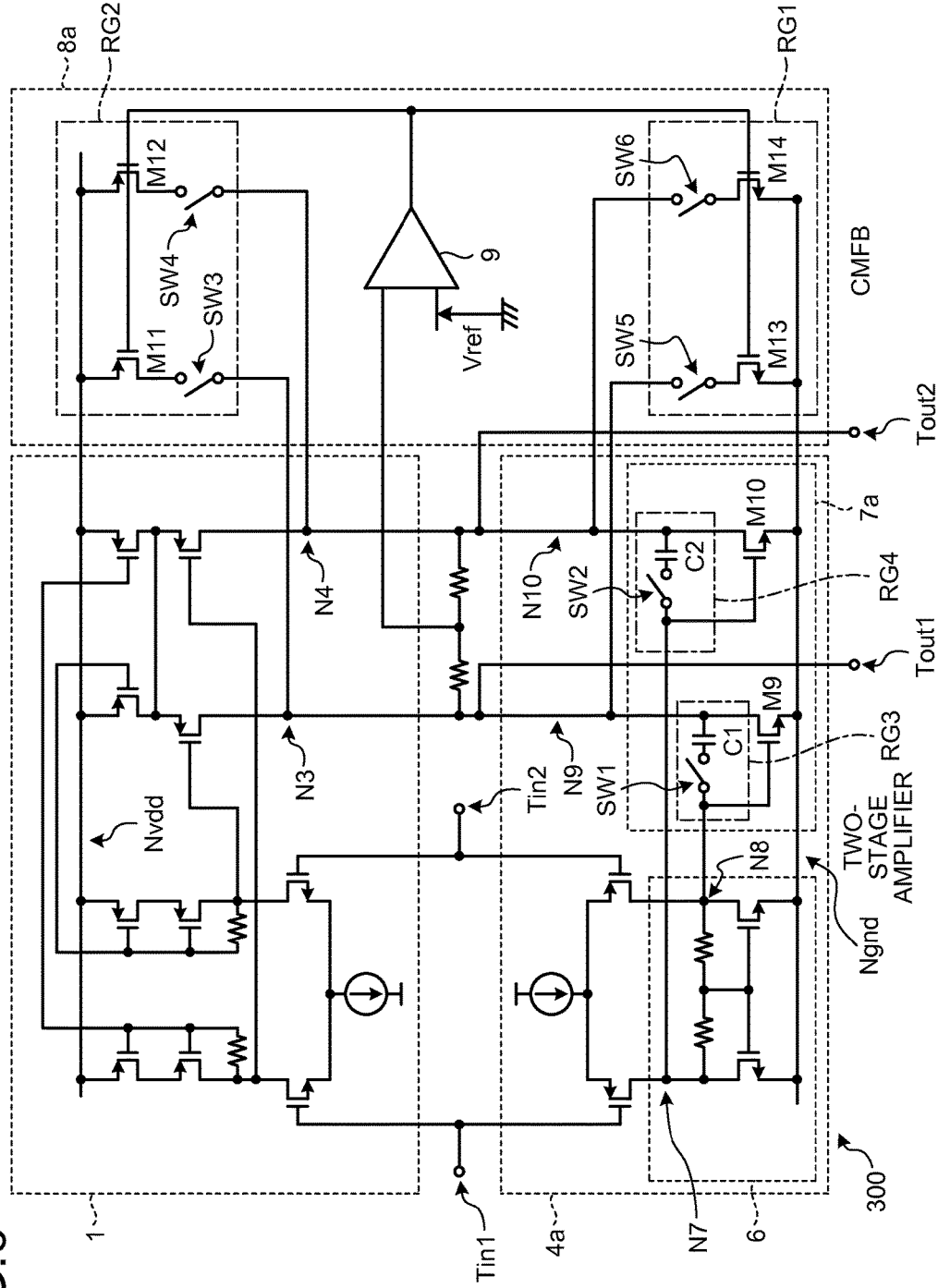
FIG. 6 is a circuit diagram showing the configuration of a semiconductor integrated circuit according to a third embodiment.

Next, a semiconductor integrated circuit 200 according to the second embodiment will be described using FIG. 4. FIG. 4 is a circuit diagram showing the configuration of the semiconductor integrated circuit 200.

The semiconductor integrated circuit 200 includes the same amplifier 1 as in the first embodiment as a one-stage amplifier and further includes a two-stage amplifier 4 and a common-mode feedback (CMFB) circuit 8.

The one-stage amplifier 1 and the two-stage amplifier 4 are electrically connected in parallel between a differential input pair Tin1, Tin2 and a differential output pair Tout1, Tout2. The one-stage amplifier 1 is formed of an input stage 2 and one stage of the active load circuit 3 (see FIG. 1) as a gain stage. Hereinafter, the active load circuit 3 as a gain stage is simply referred to as a gain stage 3. The two-stage amplifier 4 is formed of an input stage 5 and two stages of gain stages 6, 7.

The differential input pair Tin1, Tin2 are electrically connected to the input stage 5. The input stage 5 has transistors M31, M32 and a current source CS3. The transistors M31, M32 are, for example, PMOS transistors. The transistors M31, M32 have their gates electrically connected to the differential input pair Tin1, Tin2, their sources connected to the current source CS3, and their drains connected to nodes N7, N8.

The gain stage 6 is electrically connected between the input stage 5 and the gain stage 7. The gain stage 6, together with the input stage 5, forms a differential amplifying circuit. The gain stage 6 can be called a differential stage. The gain stage 6 has transistors M41, M42 and resistors R5, R6. The transistor M41 is placed between the node N7 and a ground node Ngnd. The ground node Ngnd has reference potential (e.g., ground potential). The transistor M41 is, for example, an NMOS transistor. The transistor M41 has its gate electrically connected to one end of the resistor R5, to one end of the resistor R6, and to the gate of the transistor M42, its drain connected to the node N7, and its source connected to the ground node Ngnd.

The transistor M42 is placed between the node N8 and the ground node Ngnd. The transistor M42 is, for example, an NMOS transistor. The transistor M42 has its gate electrically connected to one end of the resistor R5, to one end of the resistor R6, and to the gate of the transistor M41, its drain connected to the node N8, and its source connected to the ground node Ngnd.

The resistor R5 has its one end connected to one end of the resistor R6, to the gate of the transistor M41, and to the gate of the transistor M42, and the other end connected to the node N7.

The resistor R6 has its one end connected to one end of the resistor R5, to the gate of the transistor M41, and to the gate of the transistor M42, and the other end connected to the node N8.

The gain stage 7 is electrically connected between the gain stage 6 and the differential output pair Tout1, Tout2. The gain stage 7 has transistors M9, M10. The transistor M9 is placed between the node N9 and the ground node Ngnd. The node N9 is electrically connected to the output terminal Tout1. The transistor M9 is, for example, an NMOS transistor. The transistor M9 has its gate electrically connected to the node N8, its drain connected to the node N9, and its source connected to the ground node Ngnd.

The transistor M10 is placed between the node N10 and the ground node Ngnd. The node N10 is electrically connected to the output terminal Tout2. The transistor M10 is, for example, an NMOS transistor. The transistor M10 has its gate electrically connected to the node N7, its drain connected to the node N10, and its source connected to the ground node Ngnd.

The CMFB circuit 8 is connected between the intermediate node N11 and the differential output pair Tout1, Tout2. The intermediate node N11 is an intermediate node of the differential output pair Tout1, Tout2. The intermediate node N11 is connected to the output terminal Tout1 via a resistor R7 and connected to the output terminal Tout2 via a resistor R8, and it is configured such that a common mode voltage is extracted via the resistors R7 and R8.

The CMFB circuit 8 has a differential amplifier 9 and transistors M13, M14. The differential amplifier 9 has its inputs connected respectively to the intermediate node N11 and a reference voltage Vref and its output connected to the gates of the transistors M13, M14. The transistor M13 is, for example, an NMOS transistor. The transistor M13 has its source connected to the ground node Ngnd and its drain connected to the node N9. The transistor M14 is, for example, an NMOS transistor. The transistor M14 has its source connected to the ground node Ngnd and its drain connected to the node N10.

When the one-stage amplifier 1 and the two-stage amplifier 4 in the semiconductor integrated circuit 200 are compared, the two-stage amplifier 4 is higher in gain because the load resistance is higher as indicated by a broken line in FIG. 5A. The one-stage amplifier 1 can operate faster (over a broader band) because the load resistance is lower as indicated by a dot-dashed line in FIG. 5A. FIGS. 5A and 5B are graphs showing the operation of the semiconductor integrated circuit 200. In the gain characteristic of the two-stage amplifier 4 indicated by the broken line in FIG. 5A, two poles P1, P2 exist, and in the band around the pole P1, the phase of the output is likely to be delayed changing from 0° to −90°, and in the band around the pole P2, the phase of the output is likely to be delayed changing from −90° to −180°. In view of the usage of the semiconductor integrated circuit 200 configured to use negative feedback, the phase becoming −180° needs to be avoided because it may cause the circuit to oscillate.

Accordingly, in the semiconductor integrated circuit 200, the one-stage amplifier 1 and the two-stage amplifier 4 are connected in parallel, so that the two-stage amplifier 4 higher in gain is made to operate dominantly in the lower band, whereas the one-stage amplifier 1 broader in band is made to operate dominantly in the higher band, thus performing phase compensation as shown in FIG. 5B. In the gain characteristic of the semiconductor integrated circuit 200 shown in FIG. 5B, in the band around the pole P2, the phase of the output starts to be delayed changing from −90° to −180°, but in the band around the zero Z2, the operation of the one-stage amplifier 1 becomes dominant, so that the phase of the output advances toward −90°. Thus, the phase of the output becoming −180° can be avoided, and two-pole one-zero phase compensation that can compensate the phase while broadening the band of the amplifier in the semiconductor integrated circuit 200 can be achieved.

In this case, for example, if three blocks, i.e., the input stage and output stage of the two-stage amplifier and the one-stage amplifier are individually formed, then current is consumed in each block, so that the consumption current of the semiconductor integrated circuit 200 is likely to increase.

In contrast, in the second embodiment, transistors M9, M10 of the output stage (gain stage 7) of the two-stage amplifier 4 and transistors M5, M6, folded-back output destinations, of the current mirrors of the one-stage amplifier 1 are constituted by transistors of opposite conductivity types and connected in inverters. For example, the transistors M9, M10 are constituted by NMOS transistors, and the transistors M5, M6 are constituted by PMOS transistors, and those transistors are connected in inverters. That is, the drains of the transistors M9, M10 are respectively connected to the drains of the transistors M5, M6. Thus, current can be common to the transistor M5, M6 and the transistor M9, M10. That is, current can be common to the output stage of the two-stage amplifier 4 and the one-stage amplifier 1, so that the consumption current of the semiconductor integrated circuit 200 can be reduced.

Note that, in order to achieve the two-pole one-zero phase compensation, a multi-stage, three or more stage, amplifier may be connected in parallel with the one-stage amplifier 1. In this case, by configuring the output stage of the multi-stage amplifier and the folded-back output destinations of the current mirrors of the one-stage amplifier 1 in the same way as in FIG. 4, current may be made common to them.

(Third Embodiment)

Next, a semiconductor integrated circuit 300 according to the third embodiment will be described. Description will be made below focusing on the differences from the second embodiment.

Although in the second embodiment the phase compensation method is fixed at the two-pole one-zero phase compensation, the third embodiment enables switching the phase compensation method according to the required band.

Specifically, the semiconductor integrated circuit 300 has a two-stage amplifier 4a and a CMFB circuit 8a instead of the two-stage amplifier 4 and the CMFB circuit 8 (see FIG. 4).

The two-stage amplifier 4a has a gain stage 7a instead of the gain stage 7 (see FIG. 4). The gain stage 7a further has capacitance elements C1, C2 and switches SW1, SW2. One end of the capacitance element C1 is electrically connected to the output terminal Tout1 via the node N9, and the other end is electrically connected to one end of the switch SW1. One end of the switch SW1 is electrically connected to the other end of the capacitance element C1, and the other end is electrically connected to the node N8 in the gain stage 6. The switch SW1 is turned on to activate a region RG3 and turned off to deactivate the region RG3. When the region RG3 is activated, the capacitance element C1 functions as mirror capacitance so as to perform mirror compensation.

One end of the capacitance element C2 is electrically connected to the output terminal Tout2 via the node N10, and the other end is electrically connected to one end of the switch SW2. One end of the switch SW2 is electrically connected to the other end of the capacitance element C2, and the other end is electrically connected to the node N7 in the gain stage 6. The switch SW2 is turned on to activate a region RG4 and turned off to deactivate the region RG4. When the region RG4 is activated, the capacitance element C2 functions as mirror capacitance so as to perform mirror compensation.

The CMFB circuit 8a further has transistors M11, M12 and switches SW3, SW4, SW5, SW6. The differential amplifier 9 has its output side connected to the gates of the transistors M11, M12 and to the gates of the transistors M13, M14. The transistor M11 is, for example, a PMOS transistor. As to the transistor M11, the source is connected to the power supply node Nvdd, and the drain is connected to one end of the switch SW3. The transistor M12 is, for example, a PMOS transistor. As to the transistor M12, the source is connected to the power supply node Nvdd, and the drain is connected to one end of the switch SW4.

One end of the switch SW3 is connected to the drain of the transistor M11, and the other end is connected to the output terminal Tout1 via the node N3. One end of the switch SW4 is connected to the drain of the transistor M12, and the other end is connected to the output terminal Tout2 via the node N4. The switches SW3, SW4 are turned on to activate a region RG2 and turned off to deactivate the region RG2. When the region RG2 is activated, mirror compensation is performed.

One end of the switch SW5 is connected to the drain of the transistor M13, and the other end is connected to the output terminal Tout1 via the node N9. One end of the switch SW6 is connected to the drain of the transistor M14, and the other end is connected to the output terminal Tout2 via the node N10. The switches SW5, SW6 are turned on to activate a region RG1 and turned off to deactivate the region RG1. When the region RG1 is activated, the two-pole one-zero phase compensation is performed.

The semiconductor integrated circuit 300 is configured to be able to switch the phase compensation method (phase compensation operation) between the two-pole one-zero phase compensation (first phase compensation operation) and the mirror compensation (second phase compensation operation) according to the required band. The two-pole one-zero phase compensation is a phase compensation method which covers a broader band but requires current through the one-stage amplifier 1. The mirror compensation is a phase compensation method which covers a narrower band but can reduce current through the one-stage amplifier 1.

Figure 7:
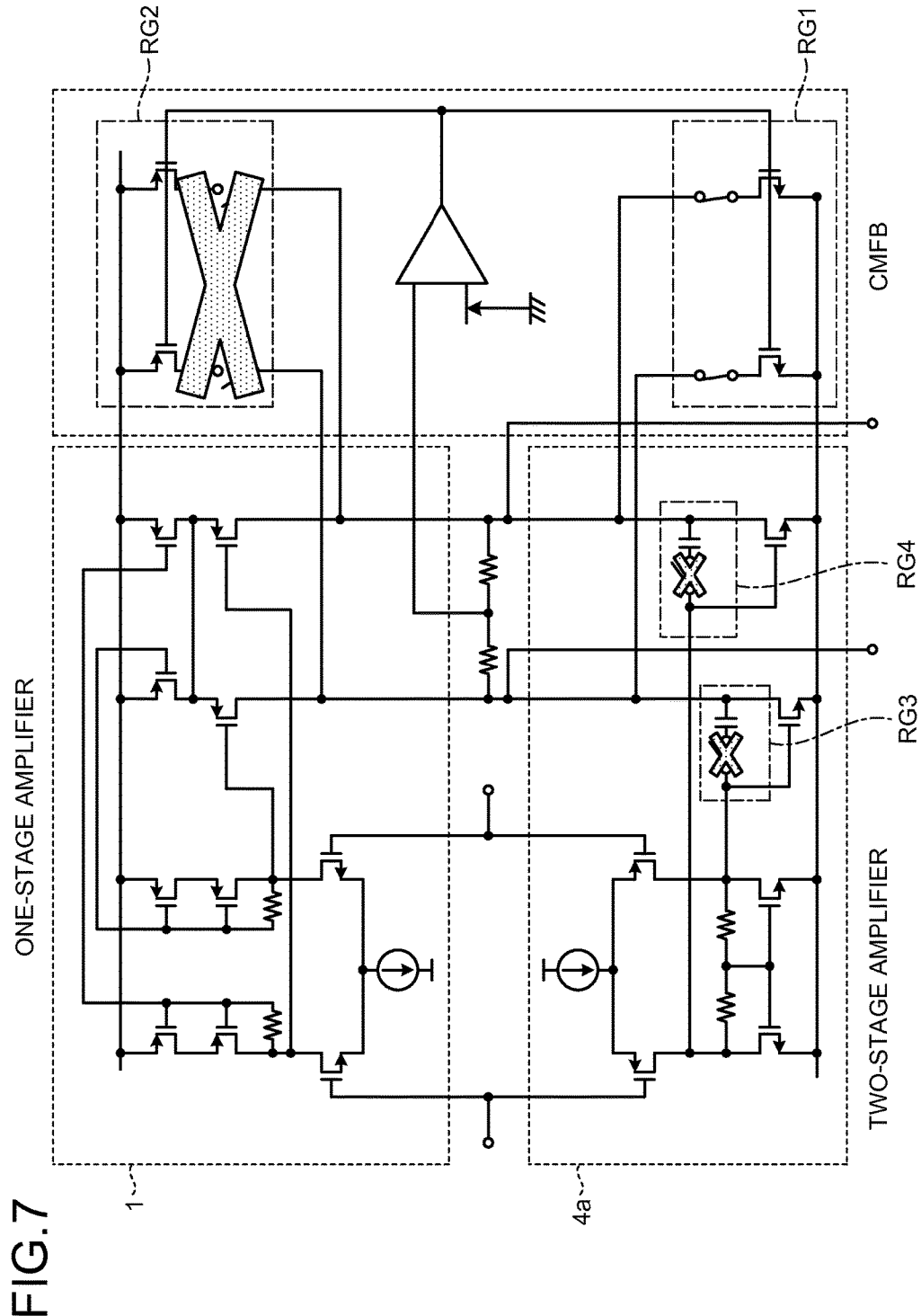
FIG. 7 is a circuit diagram showing the operation of the semiconductor integrated circuit according to the third embodiment.

For example, where the required band is broad in the use of the semiconductor integrated circuit 300, the semiconductor integrated circuit 300 is controlled to be in a two-pole one-zero phase compensation mode by an external control unit (control circuit) 120 (see FIG. 9) as shown in FIG. 7. The control unit 120 continuously supplies an ON signal to the control terminals of the switches SW5, SW6 and an OFF signal to the control terminals of the switches SW1 to SW4. Thus, the switches SW5, SW6 are kept in an ON state, and the switches SW1 to SW4 are kept in an OFF state. The region RG1 is kept in an activated state, and the regions RG2 to RG4 are kept in a deactivated state. At this time, the two-stage amplifier 4a has no mirror compensation, and the one-stage amplifier 1 is in an active state. As a result, the semiconductor integrated circuit has a parallel configuration of the two-stage amplifier 4a and the one-stage amplifier 1 as in the second embodiment, thus achieving the two-pole one-zero phase compensation suitable for a broad band.

Figure 8:
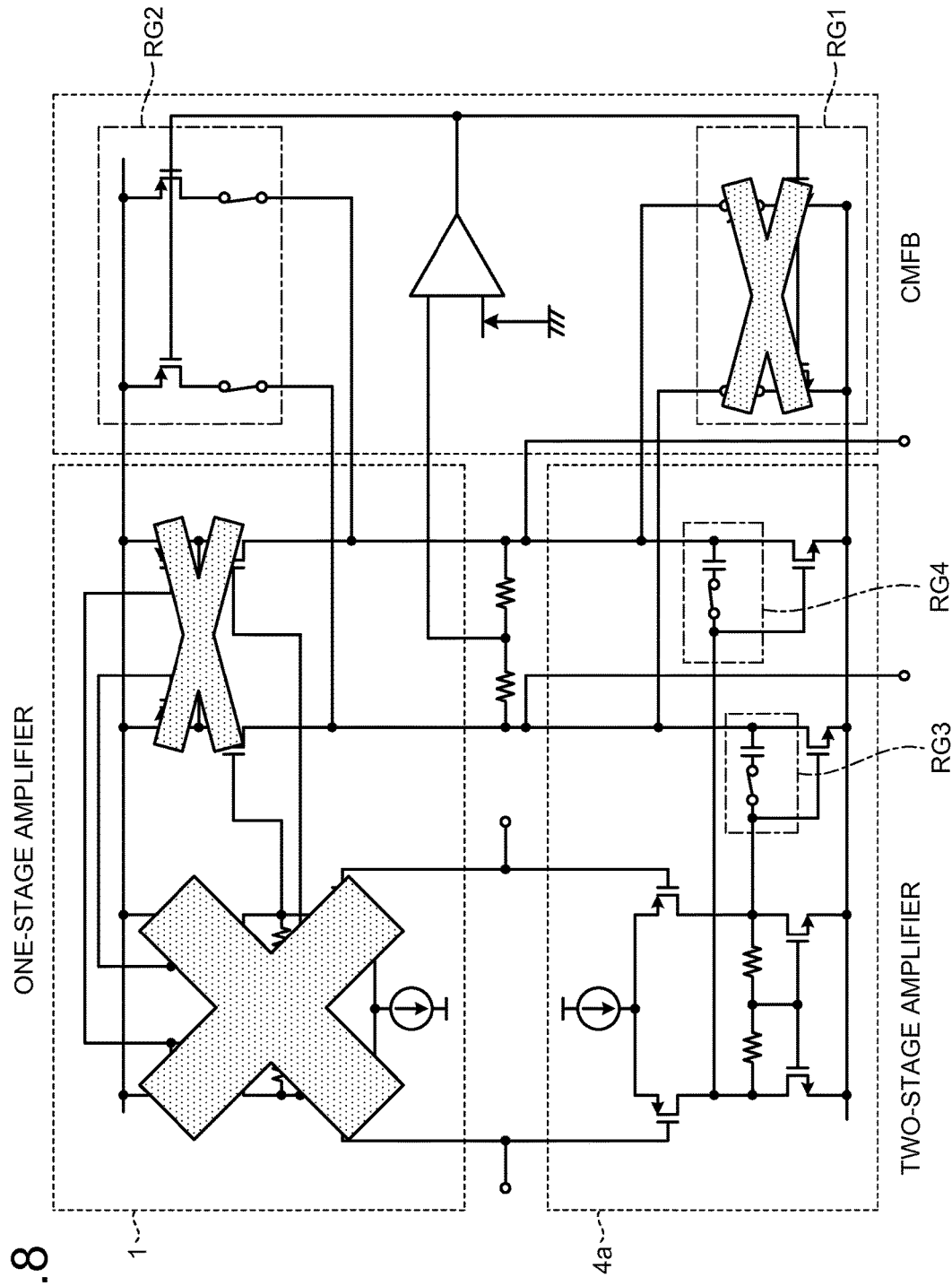
FIG. 8 is a circuit diagram showing the operation of the semiconductor integrated circuit according to the third embodiment.

For example, where the required band is narrow in the use of the semiconductor integrated circuit 300, the semiconductor integrated circuit 300 is controlled to be in a mirror compensation mode by an external control unit (control circuit) 120 (see FIG. 9) as shown in FIG. 8. The control unit 120 continuously supplies an OFF signal to the control terminals of the switches SW5, SW6 and an ON signal to the control terminals of the switches SW1 to SW4. Thus, the switches SW5, SW6 are kept in the OFF state, and the switches SW1 to SW4 are kept in the ON state. The region RG1 is kept in the deactivated state, and the regions RG2 to RG4 are kept in the activated state. At this time, in the two-stage amplifier 4a, the mirror compensation is being performed, and the one-stage amplifier 1 is cut off. Because of becoming the two-stage amplifier 4a using the mirror compensation in configuration, the semiconductor integrated circuit 300 is thought to become narrower in band than in the two-pole one-zero phase compensation mode. However, the consumption current can be reduced by the amount of current consumed by the differential pair of the one-stage amplifier 1.

As described above, in the third embodiment, the semiconductor integrated circuit 300 performs the two-pole one-zero phase compensation suitable for a broad band if the required band is broad and performs the mirror compensation with the one-stage amplifier 1 being cut off if the required band is narrow. Thus, if the required band is broad, the one-stage amplifier 1 can be made to operate so as to achieve broadening the band, and if the required band is narrow, the one-stage amplifier 1 can be cut off so as to achieve lower power consumption.

Figure 9:
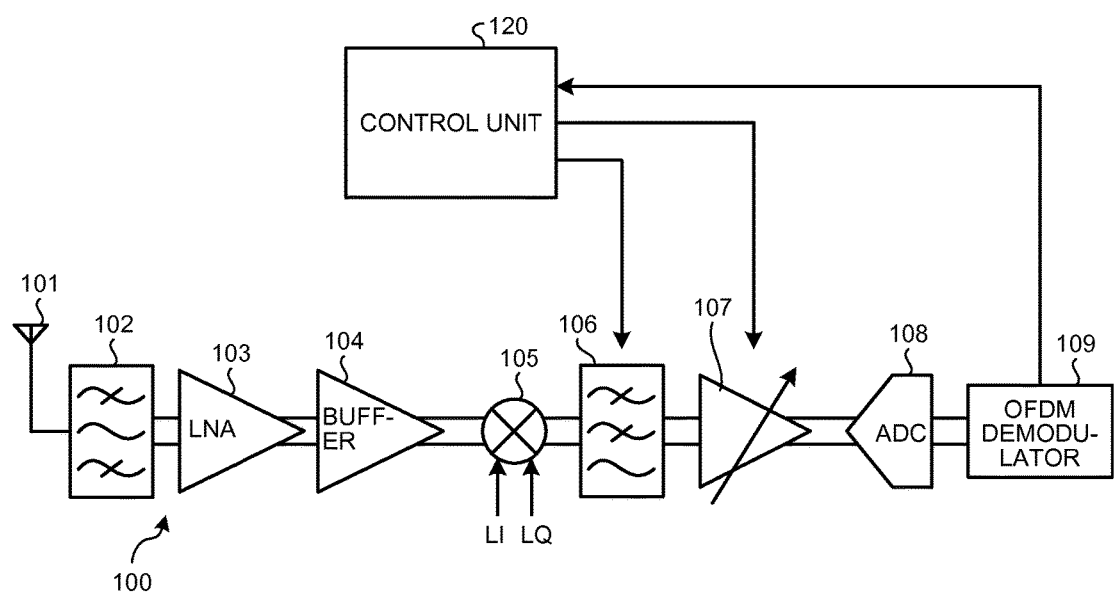
FIG. 9 is a block diagram showing the configuration of a receiver including a low pass filter to which the semiconductor integrated circuit according to the second and third embodiments is applied.

Next, a receiver 100 including a low pass filter 106 to which the semiconductor integrated circuit according to the second and third embodiments is applied will be described using FIG. 9. FIG. 9 is a block diagram showing the configuration of the receiver 100.

The receiver 100 shown in FIG. 8 receives radio waves (radio frequency signals). Specifically, the receiver 100 comprises a receiving antenna 101, a band pass filter 102, a low noise amplifier (LNA) 103, a buffer 104, a mixer 105, the low pass filter 106, a variable gain amplifier 107, an AD converter (ADC) 108, an OFDM (Orthogonal Frequency-Division Multiplexing) demodulator 109, and the control unit (control circuit) 120.

The receiving antenna 101 receives radio waves (a radio frequency signal) propagating through the space. The receiving antenna 101 supplies the received radio frequency signal to the band pass filter 102.

The band pass filter 102 selectively extracts a desired frequency component from the radio frequency signal received by the receiving antenna 101. The band pass filter 102 supplies the extracted radio frequency signal to the low noise amplifier 103.

The low noise amplifier 103 amplifies the radio frequency signal extracted by the band pass filter 102. The low noise amplifier 103 supplies the amplified radio frequency signal to the buffer 104.

The buffer 104 supplies the radio frequency signal supplied from the low noise amplifier 103 to the mixer 105.

The mixer 105 receives the radio frequency signal amplified by the low noise amplifier 103 via the buffer 104 and converts that radio frequency signal into a base band signal or an intermediate frequency signal according to local oscillator signals LI, LQ. The mixer 105 supplies the converted signal to the low pass filter 106.

The low pass filter 106 removes unnecessary high-band components from the signal supplied from the mixer 105. The low pass filter 106 supplies the high-band component removed signal to the variable gain amplifier 107.

The variable gain amplifier 107 amplifies the signal having passed through the low pass filter 106. At this time, the variable gain amplifier 107 may amplify the signal with, e.g., a gain controlled by the control unit 120. The variable gain amplifier 107 supplies the amplified signal to the AD converter 108.

The AD converter 108 A/D converts the signal supplied from the variable gain amplifier 107 to produce digital values. The AD converter 108 supplies the produced digital values to the OFDM demodulator 109.

The OFDM demodulator 109 performs OFDM demodulation processing on the supplied digital values. For example, the OFDM demodulator 109 reconstructs the original data from multiplexed digital values. The OFDM demodulator 109 supplies the reconstructed data to a predetermined circuit and the control unit 120.

Note that a differential signal can be used as the signal transmitted from the band pass filter 102 to the AD converter 108. Further, where the semiconductor integrated circuit 300 according to the third embodiment is applied to the low pass filter 106, the ON signal and OFF signal for the switches SW1 to SW6 may be supplied from the control unit 120 to the semiconductor integrated circuit 300 in the low pass filter 106.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An active load circuit comprising:
   a first transistor placed between a first node and a first reference node;
   a second transistor placed between a second node and the first reference node;
   a first resistor of which one end is connected to gate of the first transistor and the other end is connected to the first node;
   a second resistor of which one end is connected to gate of the second transistor and the other end is connected to the second node;
   a third transistor placed between the first transistor and the first reference node;
   a fourth transistor placed between the second transistor and the first reference node;
   a fifth transistor, together with the second transistor, forming a current mirror circuit and placed between a third node and the first reference node;
   a sixth transistor, together with the first transistor, forming a current mirror circuit and placed between a fourth node and the first reference node;
   a seventh transistor placed between the fifth transistor and the first reference node;
   an eighth transistor placed between the sixth transistor and the first reference node; and
   a line connecting a fifth node between the fifth transistor and the seventh transistor and a sixth node between the sixth transistor and the eighth transistor.

2. The active load circuit according to claim 1, wherein the first, second, fifth, and sixth transistors have a dimension even for each transistor.

3. The active load circuit according to claim 1, wherein the third, fourth, seventh, and eighth transistors are each configured to operate in a linear region.

4. The active load circuit according to claim 1, wherein the gate of the first transistor, of the third transistor, and of the eighth transistor are connected to each other, and
   wherein the gate of the second transistor, of the fourth transistor, and of the seventh transistor are connected to each other.

5. The active load circuit according to claim 1, further comprising a bias circuit connected to gate of the third transistor, of the fourth transistor, of the seventh transistor, and of the eighth transistor.

6. The active load circuit according to claim 5, wherein the bias circuit has:
   a current source;
   a first replica transistor connected to the current source and having characteristics equivalent to those of the first transistor; and
   a second replica transistor placed between the first replica transistor and the first reference node and having characteristics equivalent to those of the second transistor.

7. The active load circuit according to claim 6, wherein the first replica transistor has a dimension equivalent to that of the first transistor, and
   wherein the second replica has a dimension equivalent to that of the second transistor.

8. The active load circuit according to claim 1, further comprising:
   a third resistor of which one end is connected to the gate of the first transistor and of the third transistor and another end is connected to an intermediate node; and
   a fourth resistor of which one end is connected to the gate of the second transistor and of the fourth transistor and another end is connected to the intermediate node;
   wherein the intermediate node is connected to gate of the seventh transistor and of the eighth transistor.

9. The active load circuit according to claim 8, wherein resistance of the third resistor and resistance of the fourth resistor are even.

10. A semiconductor integrated circuit comprising:
    a one-stage amplifier having the active load circuit according to claim 1 as a first gain stage between a first input stage to which a first differential input pair is connected and a first differential output pair; and
    a two-stage amplifier having two stages of a second gain stage and a third gain stage between a second input stage to which the first differential input pair is connected and the first differential output pair,
    wherein the third gain stage has:
    a ninth transistor, of a conductivity type opposite to that of the fifth transistor, of which drain is connected to drain of the fifth transistor; and
    a tenth transistor, of a conductivity type opposite to that of the sixth transistor, of which drain is connected to drain of the sixth transistor.

11. The semiconductor integrated circuit according to claim 10, wherein the third gain stage further has:

a first capacitance element of which one end is connected to one output of the first differential output pair;

a first switch of which one end is connected to the other end of the first capacitance element and another end is connected to the second gain stage;

a second capacitance element of which one end is connected to the other output of the first differential output pair; and a second switch of which one end is connected to the other end of the second capacitance element and another end is connected to the second gain stage, wherein the semiconductor integrated circuit further comprises a common-mode feedback circuit connected between an intermediate node of the first differential output pair and the first differential output pair, and wherein the common-mode feedback circuit has:

an eleventh transistor of which one of source and drain is connected to one output of the first differential output pair and another end is connected to the first reference node;

a third switch of which one end is connected to drain of the eleventh transistor and another end is connected to one output of the first differential output pair;

a twelfth transistor of which one of source and drain is connected to the other output of the first differential output pair and another end is connected to the first reference node;

a fourth switch of which one end is connected to drain of the twelfth transistor and another end is connected to the other output of the first differential output pair;

a thirteenth transistor of which one of source and drain is connected to one output of the first differential output pair and another end is connected to a second reference node;

a fifth switch of which one end is connected to drain of the thirteenth transistor and another end is connected to one output of the first differential output pair;

a fourteenth transistor of which one of source and drain is connected to the other output of the first differential output pair and another end is connected to the second reference node; and a sixth switch of which one end is connected to drain of the fourteenth transistor and another end is connected to another output of the first differential output pair.

12. The semiconductor integrated circuit according to claim 10, wherein the ninth transistor is placed between the fifth transistor and the second reference node, and wherein the tenth transistor is placed between the sixth transistor and the second reference node.

13. The semiconductor integrated circuit according to claim 10, wherein a node between the fifth transistor and the ninth transistor is connected to one output of the first differential output pair, and wherein a node between the sixth transistor and the tenth transistor is connected to another output of the first differential output pair.

14. The semiconductor integrated circuit according to claim 10, wherein the second gain stage has:

a fifteenth transistor placed between a seventh node and the second reference node;

a sixteenth transistor placed between an eighth node and the second reference node;

a fifth resistor of which one end is connected to the seventh node and another end is connected to gate of the fifteenth transistor and of the sixteenth transistor; and a sixth resistor of which one end is connected to the eighth node and another end is connected to the fifth resistor and gate of the fifteenth transistor and of the sixteenth transistor.

15. The semiconductor integrated circuit according to claim 11, wherein the semiconductor integrated circuit is configured to be able to switch phase compensation operation between first phase compensation operation and second phase compensation operation, wherein in the first phase compensation operation, the first, second, third, and fourth switches are each kept in an OFF state, and the fifth and sixth switches are each kept in an ON state, and wherein in the second phase compensation operation, the first, second, third, and fourth switches are each kept in the ON state, and the fifth and sixth switches are each kept in the OFF state.

16. The semiconductor integrated circuit according to claim 15, wherein the first phase compensation operation is phase compensation operation of two-pole one-zero phase compensation, and the second phase compensation operation is phase compensation operation of mirror compensation.

17. The semiconductor integrated circuit according to claim 11, wherein the common-mode feedback circuit further has a differential amplifier whose input side is connected to the intermediate node and a reference voltage and whose output side is connected to gate of the eleventh transistor, of the twelfth transistor, of the thirteenth transistor, and of the fourteenth transistor.

18. The semiconductor integrated circuit according to claim 17, wherein the common-mode feedback circuit further has:

a seventh resistor of which one end is connected to one output of the first differential output pair and another end is connected to the intermediate node; and an eighth resistor of which one end is connected to another output of the first differential output pair and another end is connected to the intermediate node.

19. A receiver comprising a low pass filter to which the semiconductor integrated circuit according to claim 10 is applied.

20. A receiver comprising:

the semiconductor integrated circuit according to claim 10; and a control circuit that can control a phase compensation operation of the semiconductor integrated circuit to be either a first phase compensation operation or a second phase compensation operation.

* * * * *